United States Patent [19]

Schlereth

[11] Patent Number: 5,053,710
[45] Date of Patent: Oct. 1, 1991

[54] NMR MULTI-DIMENSIONAL DISCRETE FOURIER TRANSFORM

[76] Inventor: Fritz H. Schlereth, 1434 Westmoreland Ave., Syracuse, N.Y. 13210

[21] Appl. No.: 494,602

[22] Filed: Mar. 16, 1990

[51] Int. Cl.⁵ ............................................. G01R 33/20
[52] U.S. Cl. .................................... 324/309; 324/312
[58] Field of Search ............... 250/283; 324/300, 307, 324/309, 310, 311, 312, 313, 314, 318, 322; 128/653 A

[56] References Cited

U.S. PATENT DOCUMENTS

| | | | |
|---|---|---|---|
| 3,937,955 | 4/1976 | Comissarow et al. | 250/283 |
| 4,740,748 | 4/1988 | Rzedzian | 324/309 |
| 4,767,991 | 8/1988 | Rzedzian | 324/312 |
| 4,818,942 | 4/1989 | Rzedzian | 324/312 |
| 4,940,941 | 7/1990 | Rzedzian | 324/312 |

OTHER PUBLICATIONS

*Multichannel Heterodyne Detection for Accurate Mass.*, Anal. Chem. 1989, 61, 749–754.

Primary Examiner—Michael J. Tokar
Attorney, Agent, or Firm—Wall and Roehrig

[57] ABSTRACT

This invention relates to the use of a series of Discrete Fourier Transform (DFT) operations to provide multi-dimensional analysis of a molecular specimen.

12 Claims, 3 Drawing Sheets

NMR MULTI-DIMENSIONAL DISCRETE FOURIER TRANSFORM

BACKGROUND OF THE INVENTION

This invention relates to the use of a Discrete Fourier Transform (DFT) to provide multi-dimensional analysis of molecular specimens.

Working with multi-dimensional data such as the processing of Nuclear Magnetic Resonance (NMR) or Ion Cyclotron Resonance (ICR) data requires the manipulation of data sets in the gigabyte range. Heretofore, this type of data was generally processed using Fast Fourier Transform (FFT) techniques. In a two-dimensional application such as NMR or ICR, a set of time domain waveforms are generated and these waveforms are then represented in terms of frequency content by computing the correlation between a specific group of reference frequencies and each time domain waveform in the set. The degree of correlation between a specific reference frequency and a time domain waveform is known as the spectral content of the waveform at that specific frequency. The spectral content of a waveform for a group of reference frequencies is called the frequency spectrum or simply the spectrum of the time domain waveform.

In a two dimensional FFT analysis, a set of time domain waveforms are generated and the waveform is then frequency transformed using specific reference frequencies. The spectral amplitude at a particular reference frequency of each waveform in the set forms a group of values or data points which can be treated as a frequency domain waveform. A spectral analysis of these primary groups of frequency domain waveforms is performed to produce a second frequency transformation. In the FFT analysis the combined process of a primary transform on the time domain waveforms in the set and a secondary transform on the resultant frequency domain waveforms is called a two-dimensional frequency transformation. It is also possible to continue this process to higher dimensions by further transforming the secondary group of frequency waveforms.

In performing a two-dimensional FFT process, a frequency interval, the number of primary reference frequencies and the desired resolution is first decided upon. The spectrum of a single time domain waveform in the set is then computed with the restriction that all spectral amplitudes are calculated simultaneously. The advantage of the FFT procedure as the name implies is the speed by which each individual waveform can be transformed. There are, however, other disadvantages associated with the FFT procedure. It is necessary to determine the spectral content of each waveform in the set at all frequencies within the selected band of frequencies, even though some of the frequencies are of no interest. A further disadvantage associated with the FFT process is that all primary transforms must be completed before the secondary transforms can be started. This requires a relatively large amount of memory to store the primary transform data. Additionally, the primary transform data, if stored on disk, is not entered in the proper order needed to perform the transforms in the second dimension. Accordingly, a time consuming data moving operation known as corner turning or transposing must be carried out prior to executing the transforms in the second dimension. Where NMR is used to examine patients, a lengthy examination period can be both tiring and trying on the patient.

SUMMARY OF THE INVENTION

It is therefore an object of the present invention to improve multi-dimensional analysis of molecular specimens.

A further object of the present invention is to permit the multi-dimensional examination of data rich molecular regions of a specimen without having to process data relating to other regions.

A still further object of the present invention is to reduce the overall time required to carryout a multi-dimensional analysis of a molecular specimen.

Another object of the present invention is to improve multi-dimensional data processing in NMR and other singular types of molecular analyzing processes.

Yet another object of the present invention is to eliminate the need to store and transpose data between transform operations when performing a multi-dimensional analysis of a molecular specimen.

These and other objects of the present invention are attained by adding energy to one or more molecular specimens causing the molecules to oscillate periodically within a range of frequencies to provide a set of time domain waveforms, each of which contains a mixture of the frequencies present. The time domain waveforms in the set are digitized and a first Discrete Fourier Transform (DFT) operation is performed on the waveforms to provide at least one group of data points relating to a specific frequency of interest. This group of data points forms a frequency waveform that is further transformed using a second DFT operation to provide at least one data point in a second dimension. A number of frequency waveforms of interest can be calculated during the first DFT operation which, when further transformed, will provide a plurality of data points in the second dimension. The process can be further expanded into other dimensions by performing a DFT operation on the second dimension data points and so on into other dimensions.

Each DFT operation is performed by multiplying the waveform data on a point by point basis and at least one digitized reference signal of a selected frequency and the resultant products are then added to provide a dot product data point.

BRIEF DESCRIPTION OF THE DRAWING

For a better understanding of the present invention, reference will be made to the following detailed description of the invention that is to be read in association with the accompanying drawings, wherein.

DETAILED DESCRIPTION OF THE INVENTION

Although the present invention will be explained with specific regard to analyzing a molecular specimen in two dimensions, such as that found in Nuclear Magnetic Resonance spectroscopy, it should be understood that it has broader applications in any multi-dimensional processing system where large data arrays relating to molecular samples are typically analyzed using a Fast Fourier Transform (FFT) operation. Since much of the frequency domain data calculated during the FFT operation contains no useful information, particularly when dealing in multi-dimensional spectra, the present invention permits these regions of little or no interest to be ignored and only specific data rich regions to be analyzed. This selective processing is achieved at reduced computer power and without the need of performing costly and time consuming corner turning operations.

Figure 1:
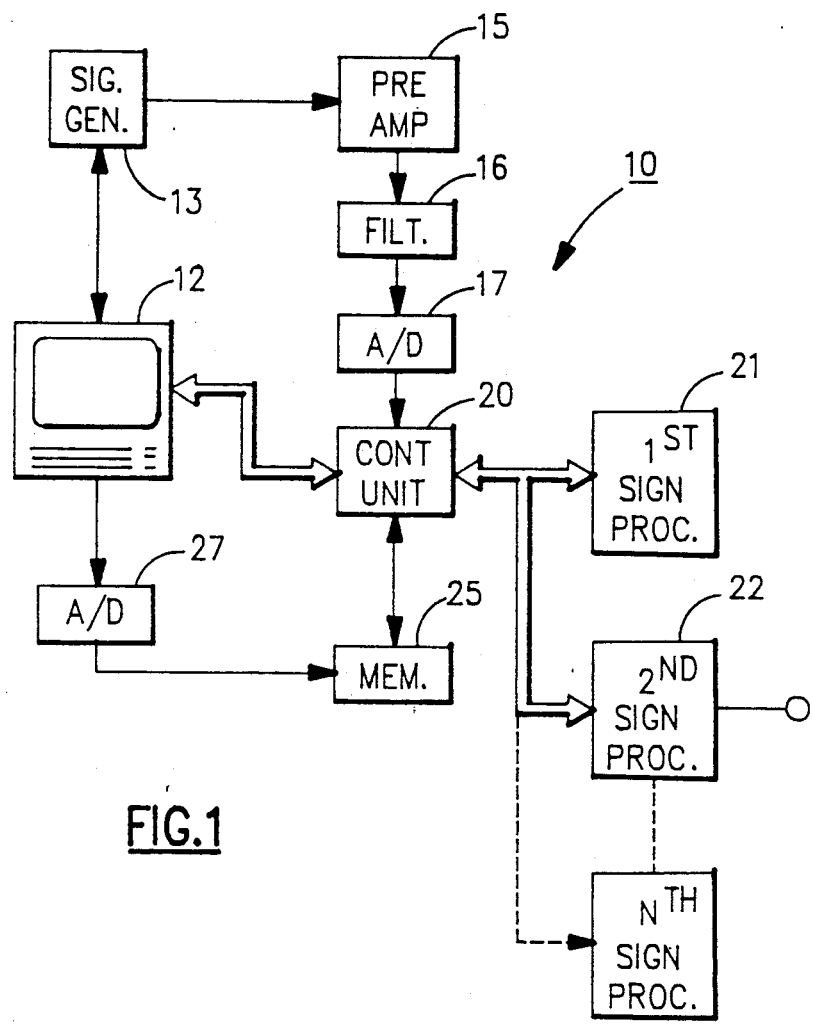
FIG. 1 is a schematic diagram showing apparatus embodying the teachings of the present invention.
Figure 3:
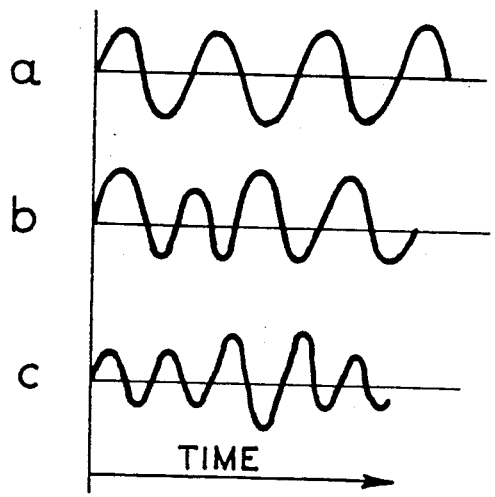
FIG. 3 illustrates a series of time domain waveforms generated from one or more molecular samples analyzed by the apparatus of FIG. 1.

Referring to FIG. 1, there is shown an analyzing system, generally referenced 10, for providing a two-dimensional analysis of a molecular specimen. The system is controlled by a central computer 12 that is connected directly to a signal generator 13. The signal generator is arranged to receive one or more molecular samples to be analyzed. The molecules contained within the sample are excited using well-known techniques. This causes the molecules present in the sample to oscillate periodically at different characteristic frequencies. The excited sample is sensed and a set of time domain waveforms are generated therefrom. Each time domain waveform in the set is a mixture of all frequencies contained in the frequency spectrum. For explanatory purposes, a set of three time domain waveforms a, b, and c are shown in FIG. 3. The waveforms are provided by the signal generator in a timed sequence and may be representative of a single molecular sample or a number of individual samples relating to generic specimens.

Each time domain waveform in the set is applied to a preamplifier 15 for amplification and then passed through an anti-aliasing filter 16 where unwanted background data and noise is removed. The waveform is next brought to an analogue to digital converter 17 where the data contained in the waveform is digitized. The digital waveform is represented as a finite set of values or data points. On the order of 1000 data points are typically used to represent each waveform in the set. A stream of digital bytes, each containing a predetermined number of bits, is delivered from the converter to control unit 20. The control unit acts as an interface between a memory 25 and a pair of signal processors 21 and 22. The signal processors are adapted to perform two separate and distinct Discrete Fourier Transform operations on the time domain waveform data to provide a two-dimensional analysis suitable for use in NMR applications and other similar applications.

Figure 4:
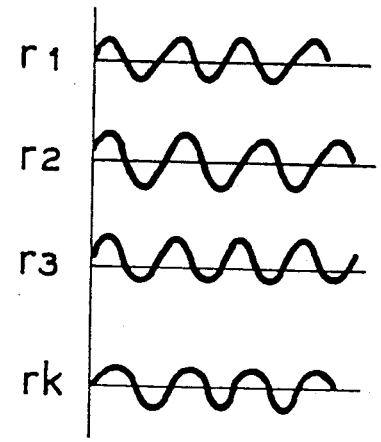
FIG. 4 illustrates a series of sinusoidal reference signals used in transforming data waveforms.

The memory 25 is arranged to store preselected digitized data relating to selected reference signals. The reference signals are applied through means of control unit 20 to the signal processors 21 and 22 in a programed order via suitable buss lines. A selected series of sinusoidal reference signals of different frequencies are illustrated in FIG. 4. The reference signals are generated by the computer 12 and are programed into the memory through A/D converter 27. Each reference signal is of a frequency of specific interest and are depicted as r1, r2, r3—rk.(FIG. 4) The reference signals are called from the memory by the control unit and applied in a programed sequence to the signal processors.

The first signal processor 21 contains circuitry for performing both a Fast Fourier Transform (FFT) or a Discrete Fourier Transform (DFT) on the individual time domain waveforms in the set. A low resolution FFT operation can be initially performed on a time domain sample data to identify data rich regions of specific interest concerning the specimen being analyzed. A visual output of the FFT data is presented on the screen of the computer for immediate evaluation. Reference signals relating to these specific areas of interest can be loaded into the memory by the computer or stored data updated to include this information. This initial low resolution FFT operation can be completed in a relatively short period of time using relatively little computer power.

Figure 2:
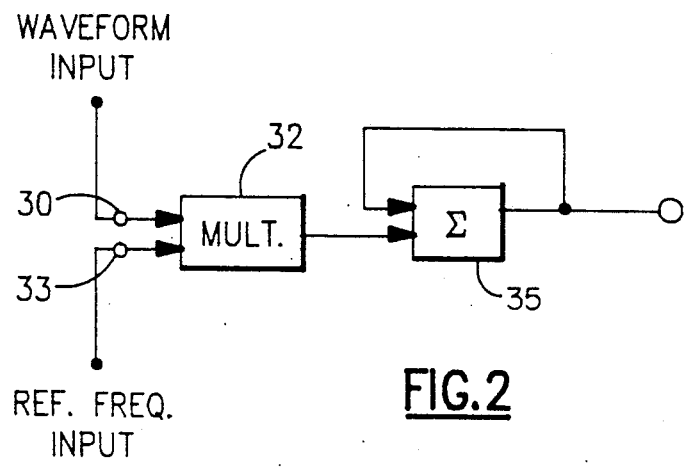
FIG. 2 is a schematic view of the signal processor employed in the apparatus of FIG. 1 showing circuitry for carrying out a Discrete Fourier Transform.

After the initial FFT operation is complete and the digitized reference signals are completely loaded into the memory, the first signal processor is instructed to carry out a first Discrete Fourier Transform operation on the digitized time domain waveforms a, b, and c. As illustrated in FIG. 2, the digitized time domain waveforms are applied in sequence to one input terminal 30 of a multiplier 32. A first reference signal stored in memory 25 is applied to the second input terminal 33 of the multiplier and the two are multiplied point by point. As long as the first reference signal is coherent with some component of the waveform data signal, a resultant product will be applied to the downstream adder 35. The adder is wired as an accumulator and will continue to sum the resultant products. At the end of the sample period, the adder will provide an amplitude signal which shall be referred to herein as a data point. The resolution of the data point signal is dependent on the number of bits in each data byte and/or the length of the sampling period. If the reference signal frequency is not present in the spectra of the time domain waveform, the resultant product values will cancel and the output of the accumulator will be near zero.

The DFT formed by the process of multiplication and accumulation, known mathematically as the "dot product" will be explained with further referenced to FIGS. 3-7.

Waveform a (FIG. 3), when digitized, will contain a series of amplitude values which are a1, a2 ... an. Digitized waveforms b and c contain similar values. The digitized reference waveforms r1, r2, r3 ... rb (FIG. 4) contain similar amplitude values. For reference signal r1, these values can be expressed as r11, r12 ... r1n. The dot product for the time domain waveform "a" and reference waveform r1 can now be defined as:

$$a1^*r1 : a2^*r12 \ldots + an^*r1n = sum\ (ai^*r1i) \qquad (1)$$

where:
i=1 to n

Figure 5:
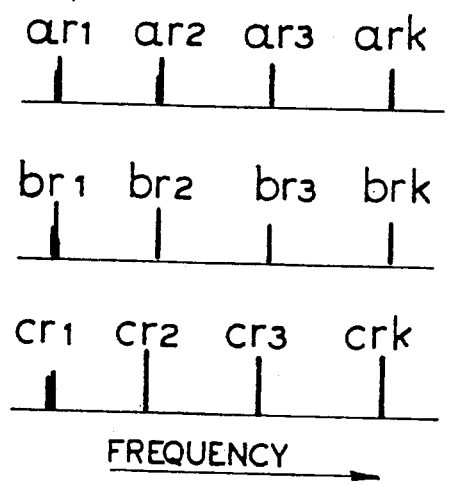
FIG. 5 illustrates a series of frequency domain waveforms generated by transforming the time domain waveforms shown in FIG. 3.

The DFT of waveform "a" thus consists of the dot product of each of the amplitude values found in digitized waveform "a" and reference waveform r1 which is noted simply as ar1 in FIG. 5. Each reference waveform corresponds to a particular frequency of interest and thus a DFT of each time domain waveform in the set can be expressed as the spectrum of the reference signal. Accordingly, the complete DFT of waveform "a" can have k points namely ar1, ar2, ar3 ... ark. The DFT of the second waveform "b" in the sets will have a similar number of data points as will third waveform "c".

Figure 6:
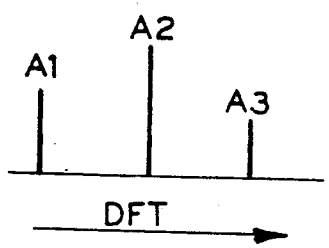
FIG. 6 shows a frequency domain waveform generated by transforming a group of data points in the frequency domain waveforms illustrated in FIG. 5.
Figure 7:
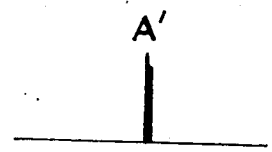
FIG. 7 illustrates an output signal that is generated by performing the second Discrete Fourier Transform on waveform shown in FIG. 6.

Considering the data points ar1, br1 and cr1 it can be seen they represent a group of amplitude values relating to a specific frequency which can be further transformed to find a new data point in a second dimension. For purposes of simplifying the present explanation, let ar1, br1, cr1 ... =A1; ar2, br2, cr2 ... =A2, and so on. Data points A1, A2, A3 combine as shown in FIG. 6 to establish a frequency waveform relating to the reference frequency associated with r1. Using the data points ar2, br2, and cr2 a second frequency waveform can be established relating to the second reference frequency r2 and so on up to reference frequency rk. A second DFT can now be performed on each frequency waveform to provide a new set of data points in a second dimension. Here again, the original series of reference signals (FIG. 4) may be used or a new group called up from memory. The second DFT is carried out by the second signal processor 22 in response to instructions from the control unit 20. The dot product of the A group of data points will have the following form:

$$A1 * r11 + A2 * r12 + \ldots = sum(Ai * rli) = A' \quad (2)$$

where: i=1 to n

The dot product of the second or B group will be sum $(Bi*r2i)=B'$ and so on for the remaining group. As should now be evident, it is possible in this manner to construct a two dimensional array called a 2-D Fourier Transform.

It should be noted that the flow of data through the first and second signal processors moves in a continuous uninterrupted stream. Unlike the FFT method, there is no corner turning or transposing step required as data moves between the two transform operations. This represents a considerable savings in storage capacity and in time which is a necessity when carrying out the transposing operation. As noted above, the use of a FFT operation in multi-dimensional analysis requires that all spectral amplitudes or data points be computed even though it may be known, based on other information, that there is no data of interest in certain spectral regions. There exists no such restriction on the DFT process as herein disclosed and only those spectral amplitudes that are meaningful need be computed.

Figure 8:
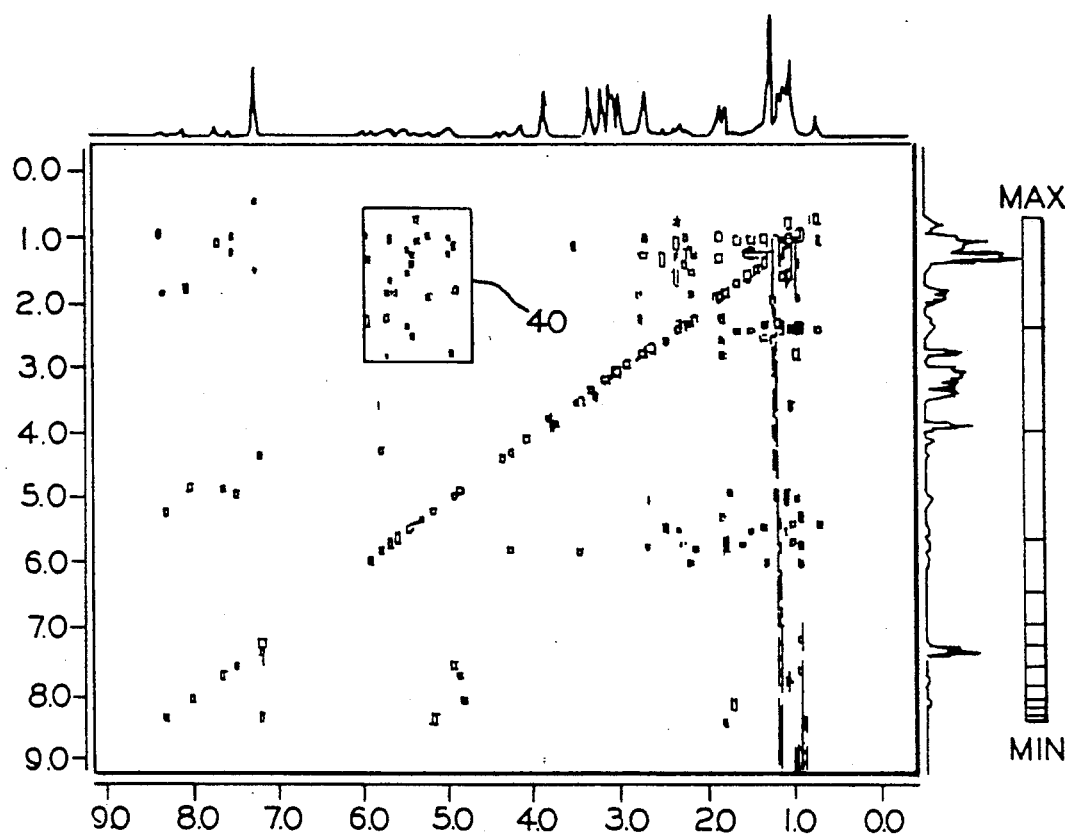
FIG. 8 illustrates a diagram of a two-dimensional spectra with the spectra, being represented as elevation contours.
Figure 9:
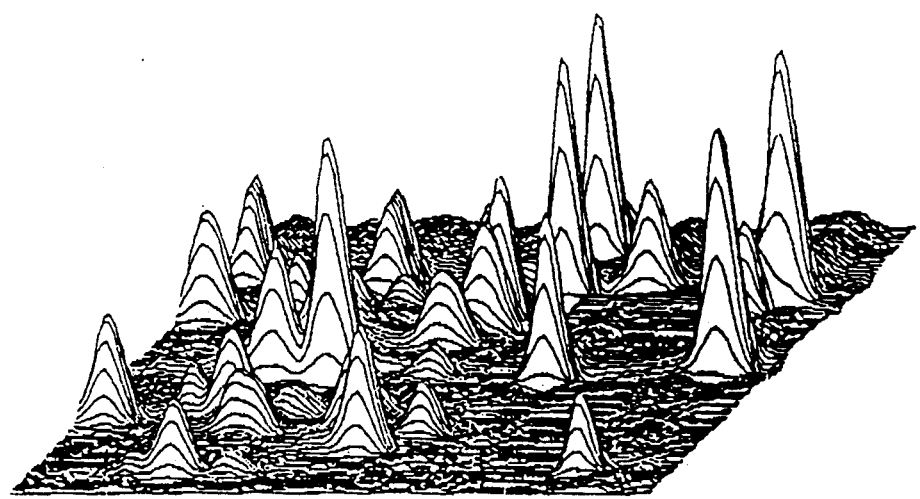
FIG. 9 illustrates a stacked plot of the region shown in FIG. 8 generated using the multi-dimensional Discrete Fourier Transform technique of the present invention.

A typical example of a 2-D NMR spectrum is illustrated in FIGS. 8 and 9. FIG. 8 shows a top view of a typical spectra with the spectra being represented as elevation contours. The waveforms along the top and the right margins are projections of the contours at these edges. A region that is rich in data is outlined by the frame 40. Using the two dimension technique described above, it is now possible to construct the stacked plot shown in FIG. 9 regarding this particular region to the exclusion of all other regions. The stacked plot is virtually identical to one obtained using the more time consuming and complex FFT method and provide sufficient data by which a meaningful analysis can be made of the particular region of interest.

It should be clear from the description above that the DFT method herein disclosed can be expanded into further dimensions without departing from the teachings of the present invention by simply generating frequency waveforms as explained above in each of the additional dimensions.

While this invention has been explained with reference to the structure disclosed herein, it is not confined to the details as set forth and this application is intended to cover any modifications and changes as may come within the scope of the following claims.

What is claimed is:

1. Apparatus for providing a multi-dimensional analysis of a molecular specimen that includes
    a signal generator for adding energy to one or more molecular samples to cause the molecules to oscillate periodically within a range of characteristic frequencies and provide a set of time domain waveforms, each of which contains a mixture of said periodic oscillations,
    converting means for digitizing the data contained in each waveform in the set,
    a first signal processing means having a multiplying means coupled to an adder means for performing a first Discrete Fourier Transform (DFT) operation on each digitized time domain waveform in the set by multiplying point by point each digitized waveform and a digitized reference frequency of a preselected frequency and summing the resultant products to provide a data point for each waveform in the set, said frequency related data points forming a frequency domain waveform,
    a second signal processor means containing a multiplying means coupled to an adder means for performing a second Discrete Fourier Transform (DFT) operation on said first frequency domain waveform by multiplying the first frequency waveform and a digitized reference signal of a preselected frequency and summing the resultant products to produce a frequency data point in a second dimension.

2. The apparatus of claim 2 wherein the output of the adder means of said first signal processor means is directly connected to an input of the multiplying means whereby said second DFT operation is performed without transposing said first DFT operation data.

3. The apparatus of claim 2 that further includes a memory means for storing said digitized reference signals, said memory means being coupled to an input of each of said multiplying means, and a control means for applying selected reference signals to said multiplying means in a desired sequence.

4. The apparatus of claim 3 that further includes computer means for entering selected reference frequencies into said memory.

5. The apparatus of claim 4 wherein a plurality of reference signals are multiplied with each digitized time domain waveform in the set to provide a series of frequency domain waveforms during the first DFT operation and at least one other reference signal is multiplied with each of the frequency domain waveforms during the second DFT operation.

6. The apparatus of claim 5 wherein a plurality of reference signals are multiplied with the frequency domain waveforms during the second DFT operation to provide a second group of frequency domain waveforms in the second dimension and further signal processing means for performing a DFT operation on the second group of frequency domain waveforms to provide data points in at least one other dimension.

7. A method of performing a multi-dimensional analysis of a molecular specimen that includes the steps of
exciting a molecular sample to cause the molecules in the sample to periodically oscillate at their characteristic frequencies,
generating a set of time domain waveforms from the excited molecules, each of which contains a mixture of said characteristic frequencies,
digitizing each of said time domain waveforms,
performing a first Discrete Fourier Transform (DFT) operation on each time domain waveform in the set by multiplying the digitized time domain waveform with at least one digitized reference signal of a desired frequency and summing the resultant products to provide a frequency data point for each time domain waveform in the set, said data points forming a frequency domain waveform,
performing a second Discrete Fourier Transform operation on the frequency domain waveform by multiplying the frequency domain waveform and a digitized reference signal of a predetermined frequency and summing the resultant products to provide at least one data point in a second dimension.

8. The method of claim 7 that includes the further step of multiplying the digitized time domain waveform and a plurality of reference signals of different frequencies during the first DFT operation to provide a series of frequency domain waveforms relating to said reference signal frequencies.

9. The method of claim 8 that includes the further step of multiplying each of said frequency domain waveforms with a plurality of reference signals of different frequencies during the second DFT operation to provide a second series of frequency domain waveforms in the second dimension and carrying out further DFT operations on said second series of frequency domain waveforms to expand the analysis into other dimensions.

10. The method of claim 7 that includes the further step of storing the digitized reference signal in memory.

11. The method of claim 7 that includes the further step of performing a low resolution Fast Fourier Transform (FFT) operation on at least one digitized time domain waveform in the set and identifying frequencies of interest from the FFT data.

12. The method of claim 7 that includes the further step of amplifying each of the time domain waveforms and filtering out background noise prior to digitizing said waveforms.

* * * * *